(12) United States Patent
Togano

(10) Patent No.: US 9,411,752 B2
(45) Date of Patent: Aug. 9, 2016

(54) CONVERSION DEVICE, PERIPHERAL DEVICE AND PROGRAMMABLE LOGIC CONTROLLER

(71) Applicant: Kentaro Togano, Tokyo (JP)

(72) Inventor: Kentaro Togano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/439,771

(22) PCT Filed: Nov. 1, 2012

(86) PCT No.: PCT/JP2012/078331
§ 371 (c)(1),
(2) Date: Apr. 30, 2015

(87) PCT Pub. No.: WO2014/068747
PCT Pub. Date: May 8, 2014

(65) Prior Publication Data
US 2015/0317260 A1   Nov. 5, 2015

(51) Int. Cl.
| | | |
|---|---|---|
| G06F 13/12 | (2006.01) | |
| G06F 13/10 | (2006.01) | |
| G06F 13/42 | (2006.01) | |
| H03H 17/06 | (2006.01) | |
| H03M 1/12 | (2006.01) | |

(52) U.S. Cl.
CPC .......... *G06F 13/102* (2013.01); *G06F 13/4221* (2013.01); *H03H 17/06* (2013.01); *H03M 1/12* (2013.01)

(58) Field of Classification Search
CPC .... G06F 13/102; G06F 13/4221; G06F 13/05

USPC ........................................................ 710/69
See application file for complete search history.

(56) References Cited

FOREIGN PATENT DOCUMENTS

| | | |
|---|---|---|
| CN | 102053186 A | 5/2011 |
| DE | 1120120070976 A | 2/2016 |
| JP | 58-147223 A | 9/1983 |
| JP | 60-46126 A | 3/1985 |
| JP | 1-176113 A | 7/1989 |

(Continued)

OTHER PUBLICATIONS

International Search Report of PCT/JP2012/078331, dated Nov. 27, 2012. [PCT/ISA/210].

(Continued)

*Primary Examiner* — Ernest Unelus
(74) *Attorney, Agent, or Firm* — Sughrue Mion, PLLC

(57) ABSTRACT

An A/D conversion device includes an input-data storage unit storing therein a plurality of digital values obtained after A/D conversion so that each of the digital values is positioned at a fixed address according to a delay amount, a coefficient-data storage unit, a coefficient-data computation unit that, when a digital-filter process performing request is inputted, calculates an order and a filter coefficient based on a filter characteristic set beforehand, arranges calculated filter coefficients in order of delay amount, respectively, and stores the filter coefficients in the coefficient-data storage unit so that each filter coefficient is positioned at a fixed address according to the corresponding delay amount, and a digital-filter computation unit respectively reading a digital value from the input-data storage unit and a filter coefficient from the coefficient-data storage unit for each delay amount and performing a filter computation based on the read values for each delay amount.

11 Claims, 4 Drawing Sheets

(56) References Cited

FOREIGN PATENT DOCUMENTS

| JP | 2002-304818 A | 10/2002 |
|----|---------------|---------|
| JP | 2005-164500 A | 6/2005  |
| JP | 2006-20937 A  | 1/2006  |
| JP | 2007-43731 A  | 2/2007  |
| JP | 2011-147009 A | 7/2011  |

OTHER PUBLICATIONS

Communication dated Oct. 9, 2015, from the State Intellectual Property Office of People's Republic of China in counterpart Application No. 201280076807.2.

German Office Action, in application No. 112012007097.6, dated Feb. 26, 2016.

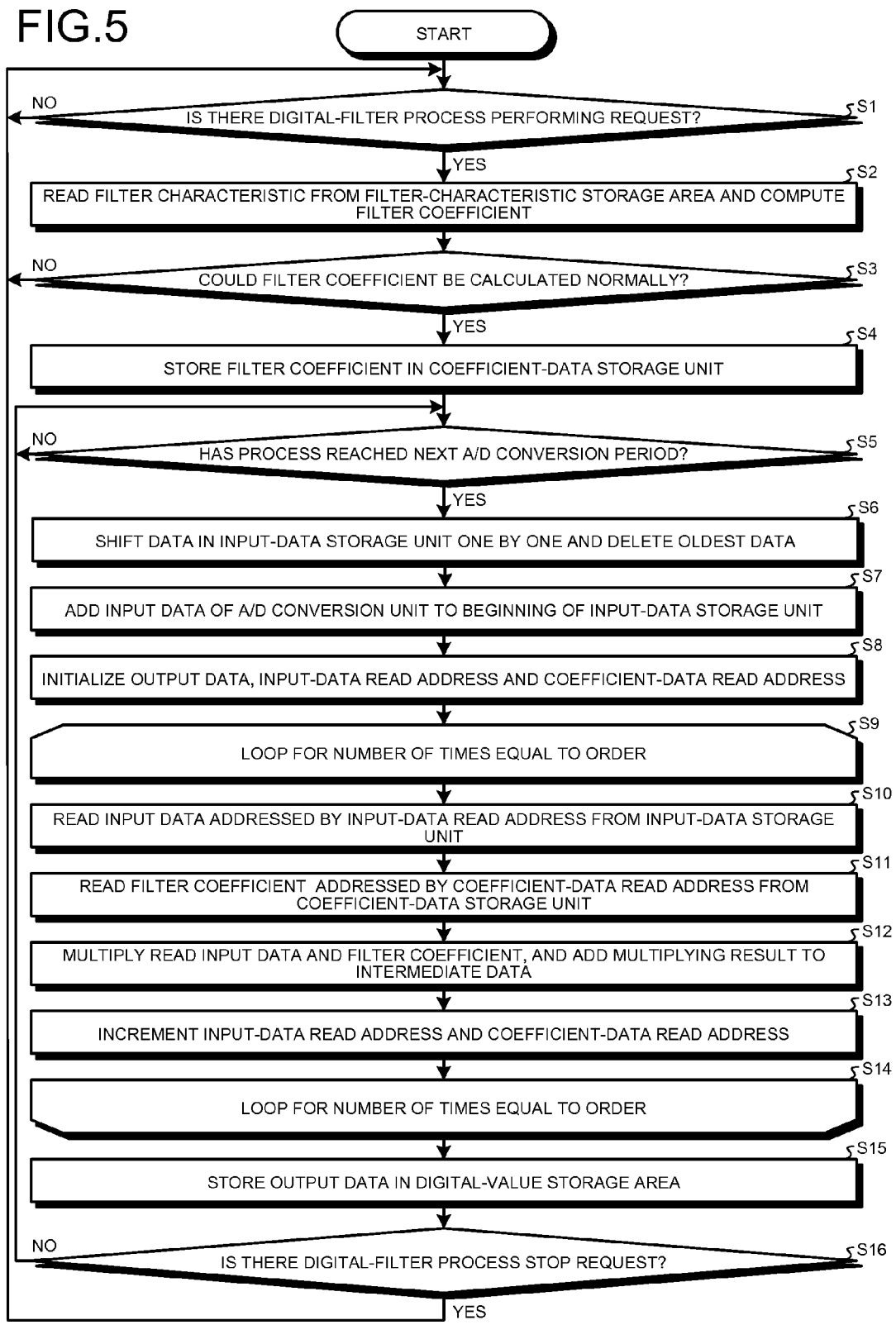

CONVERSION DEVICE, PERIPHERAL DEVICE AND PROGRAMMABLE LOGIC CONTROLLER

CROSS REFERENCE TO RELATED APPLICATIONS

This application is a National Stage of International Application No. PCT/JP2012/078331 filed Nov. 1, 2012, the contents of all of which are incorporated herein by reference in their entirety.

FIELD

The present invention relates to a conversion device that performs analog-to-digital conversion (A/D conversion), a peripheral device that operates or sets the conversion device according to an operation of a user, and a programmable logic controller that includes the conversion device.

BACKGROUND

In the case where analog data are inputted to a programmable logic controller (PLC), the PLC is configured to incorporate a conversion device (hereinafter referred to as A/D conversion device) therein, the conversion device converting an analog value into a digital value. An analog value inputted to the A/D conversion device contains various noise components according to the environment in which the PLC is installed. Particularly, an A/D conversion period of the A/D conversion device has been shortened in recent years, and noises that could not be sensed by a conventional A/D conversion device have been inputted thereto. The A/D conversion device includes an averaging processing function and a digital filter function as a function for attenuating noises. For a digital filter included in the A/D conversion device, a first-order lag filter, a low-pass filter, etc. may be used. The A/D conversion device is configured for a user to be able to use any of these filters according to application. The A/D conversion device can separate the frequency band of a signal desired by a user and the frequency band of a noise component and attenuate the noise component.

However, according to an A/D conversion device incorporated in a conventional PLC, when a desired filter characteristic cannot be obtained, a user has to perform a filter computation using a user program. Such execution of the filter computation using a user program may cause man-hours for creating a program to be increased and the CPU scan time to be increased.

In various production apparatuses having their PLCs installed therein, a single device is usually set to be able to produce a number of products. In such a case, when a product to be produced is changed, a program in the PLC is changed by pressing an external switch or a screen of a programmable display so as to change parameters to activated at a time. At this time, it is necessary to have means for easily changing parameters in an A/D conversion device in response to a request from the program in the PLC or a request of the programmable display.

In this connection, for example, Patent Literature 1 discloses a technique of storing previous input data in a ring buffer and two sets of coefficient data required for a digital filter process in a memory in advance. According to this technique, a termination determining process for a ring buffer process is not needed, and as a result the computation can be speeded up.

In addition, for example, Patent Literature 2 discloses a device that can calculate coefficient data according to a filter characteristic that has been inputted from outside.

CITATION LIST

Patent Literatures

Patent Literature 1: Japanese Patent Application Laid-open No. 2007-43731
Patent Literature 2: Japanese Patent Application Laid-open No. S58-147223

SUMMARY

Technical Problem

However, according to the technique of Patent Literature 1 mentioned above, while the computation is speeded up, the size of a memory area for storing coefficient data is about twice the minimum size required. Therefore, there is a problem that memory usage is increased.

The technique of Patent Literature 2 has a problem that there are not any means for responding to a parameter change request from a PLC or a programmable display, which are required for an A/D conversion device incorporated in the PLC.

The present invention has been achieved in view of the above-mentioned circumstances, and an object of the present invention is to provide an A/D conversion device, a peripheral device, and a programmable logic controller, which can realize a digital filter process with a filter characteristic desired by a user while keeping a speed-up A/D conversion period.

Solution to Problem

In order to solve the above-mentioned problems and achieve the object, the present invention provides a conversion device comprising: an A/D conversion unit that sequentially converts an analog value into a digital value for each A/D conversion period and outputs the digital value; an input-data storage unit that arranges a plurality of digital values that are outputted most lately in order of delay amount and stores therein the digital values so that each of the digital values is positioned at a fixed address according to a delay amount; a filter-characteristic storage unit that stores therein setting information for specifying a filter characteristic; a coefficient-data storage unit that stores therein a filter coefficient; a receiving unit that receives an execution request; a coefficient-data computation unit that, when the receiving unit receives the execution request, reads setting information out from the filter-characteristic storage unit to calculate an order and filter coefficients number of which is equal to the order based on the read setting information, arranges the calculated filter coefficients in order of delay amount, respectively and stores the filter coefficients in the coefficient-data storage unit so that each of the filter coefficients is positioned at a fixed address according to the corresponding delay amount; and a digital-filter computation unit that performs for each A/D conversion period an operation of reading digital values number of which is equal to the calculated order from the input-data storage unit and filter coefficients the number of which is equal to the calculated order from the coefficient-data storage unit based on addresses where the values and coefficients are stored for each delay amount, respectively, performing a filter computation based on the read values for each delay amount, and outputting a computation result thereof.

Advantageous Effects of Invention

The conversion device according to the present invention can achieve an advantageous effect that the conversion device can start to output a digital value undergoing treatment of a digital filter having a designated filter characteristic and perform a digital filter process for each A/D conversion period, so that a digital filter process with a filter characteristic desired by a user is realized while keeping shorter A/D conversion period.

BRIEF DESCRIPTION OF DRAWINGS

FIG. 5 is a flowchart for explaining an operation of an A/D conversion device.

DESCRIPTION OF EMBODIMENTS

Embodiments of an AD conversion device, a peripheral device, and a programmable logic controller (hereinafter, "PLC") according to the present invention will be explained below in detail with reference to the accompanying drawings. It is noted that the present invention is not limited to the embodiments.

Embodiment

Figure 1:
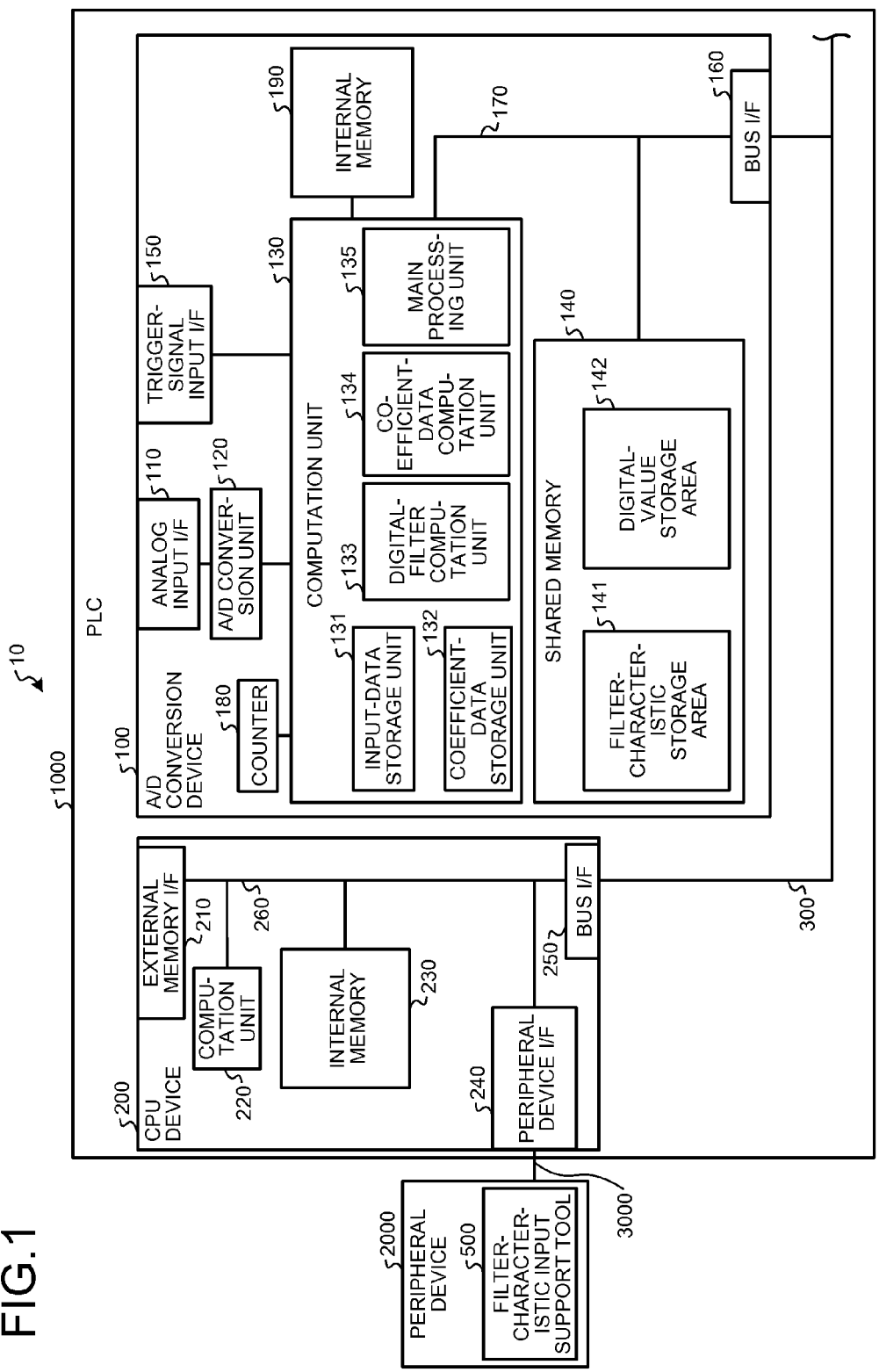
FIG. 1 is a block diagram illustrating a configuration of a PLC system.

FIG. 1 is a block diagram illustrating a configuration of a PLC system having an A/D conversion device incorporated therein. A PLC system 10 shown in FIG. 1 includes a PLC 1000 and a peripheral device 2000. The PLC 1000 and the peripheral device 2000 are connected to each other via a connection cable 3000.

The peripheral device 2000 can operate or set the PLC 1000 according to an input from a user. The peripheral device 2000 includes a filter-characteristic input support tool 500 for inputting a filter characteristic to an A/D conversion device 100 according to an embodiment of the present invention. The filter-characteristic input support tool 500 is realized by installing a filter-characteristic input software in the peripheral device 2000. Specifically, the peripheral device 2000 includes a CPU (Central Processing Unit), a ROM (Read Only Memory) that stores therein a filter-characteristic input software in advance, a RAM (Random Access Memory), an input device that is constituted by a mouse, a keyboard and/or the like for receiving an input from a user, which receives an operation directly from the user, and a display device that is constituted by a liquid crystal display or the like. The CPU deploys the filter-characteristic input software in the RAM and functions as the filter-characteristic input support tool 500 based on control by the filter-characteristic input software deployed in the RAM. The display contents generated by the filter-characteristic input support tool 500 are displayed on the display device. A user can operate the filter-characteristic input support tool 500 by operating the input device while checking the display contents.

The PLC 1000 includes the A/D conversion device 100 and a CPU device 200. The PLC 1000 may further include other devices not shown in figures. Examples of a device that can be included in the PLC device 1000, other than the A/D conversion device 100 and the CPU device 200, include a motion controller device that realizes multi-axis position control by controlling a servo amplifier and a temperature controller device that outputs a temperature control signal based on a command from the CPU device 200. The respective devices included in the PLC 1000 are connected to each other via an inter-device bus 300.

The CPU device 200 includes a computation unit 220 that executes control of the whole of the CPU device 200, an external memory interface 210 that is connected to an external memory such as a memory card, and an internal memory 230. A user program, data used for executing the user program, and data of an execution result of the user program are stored in the external memory or the internal memory 230. The user program is a program for controlling an external device targeted by the PLC 1000 as a control target, and is described by, for example, the ladder language or the C language. The CPU device 200 also includes a peripheral device interface 240 that is connected to the peripheral device 2000 and a bus interface 250 that is connected to the inter-device bus 300. The external memory interface 210, the computation unit 220, the internal memory 230, the peripheral device interface 240, and the bus interface 250 are connected to each other via an internal bus 260.

The CPU device 200 repeatedly executes a user program and performs reading of data used for execution of the user program and writing of an execution result of the user program for each predetermined control period. This control period is equal to an execution period of the user program executed by the CPU device 200. The writing of an execution result of the user program includes an operation of writing a filter characteristic, a digital-filter process performing request or a digital-filter process stop request in a shared memory 140 of the A/D conversion device 100, which is explained later.

The A/D conversion device 100 includes a computation unit 130 that controls the whole of the A/D conversion device 100, the shared memory 140 that is configured to be capable of writing and reading based on instructions from the CPU device 200, and an A/D conversion unit 120. The A/D conversion device 100 also includes an analog input interface 110 connected to an external device (that is, a controlled device) that is a control target of the PLC 1000, a trigger-signal input interface 150 connected to an external input terminal for receiving a trigger signal, a bus interface 160 connected to the inter-device bus 300, a counter 180 that outputs a counter signal for each A/D conversion period, and an internal memory 190. The A/D conversion period means a value set as a period of converting one analog value into a digital value.

The computation unit 130, the shared memory 140, and the bus interface 160 are connected to each other via an internal bus 170. The A/D conversion unit 120 is connected to the computation unit 130, and the analog input interface 110 is connected to the A/D conversion unit 120. The trigger-signal input interface 150 is connected to the computation unit 130.

The A/D conversion unit 120 takes in an analog value outputted by a controlled device via the analog input interface 110 each time the counter 180 outputs a counter signal (that is, for each A/D conversion period). Then, the A/D conversion unit 120 sequentially converts the analog value that has been taken in, into a digital value and outputs the digital value.

The computation unit 130 can perform a digital filter process on input data. The input data are a digital value for each A/D conversion period, which is obtained from the A/D conversion unit 120. Explanations are given below assuming that the computation unit 130 performs a process as an FIR (Finite Impulse Response) digital filter (hereinafter, "FIR filter") as one example of digital filter processes.

Figure 2:
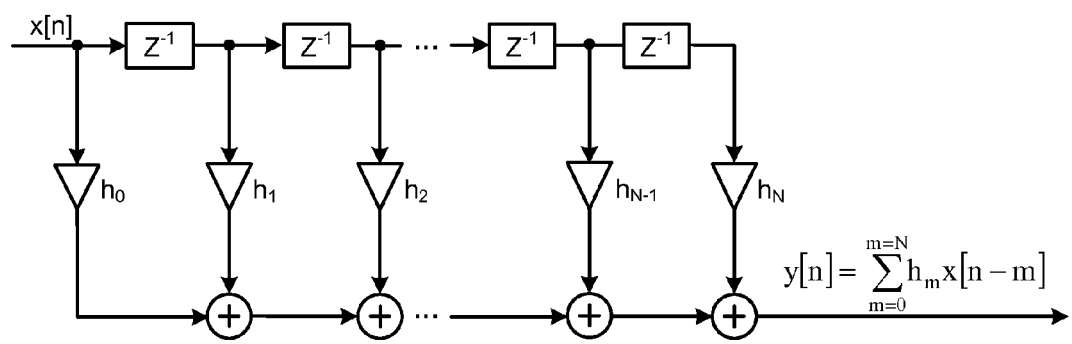
FIG. 2 is a circuit diagram of an FIR filter.

FIG. 2 is a circuit diagram of an FIR filter. In FIG. 2, Z-1 denotes a unit delay circuit and $h_0$ to $h_N$ denote multipliers that multiply filter coefficients ($h_0$ to $h_N$). By a circuit of the FIR filter, input data x are sequentially inputted and output data y are sequentially outputted. Assuming that the input data of an i-th cycle is denoted by x[i] and the output data of an i-th cycle is denoted by y[i], the output data y[n] are given by the following formula.

$$y[n] = h_0 * x[n] + h_1 * x[n-1] + \ldots + h_{N-1} * x[n-(N-1)] + h_N * x[n-N] \quad (1)$$

In FIG. 2, an order of the FIR filter is set to be N+1. The order means the number of multipliers used for a process.

To realize the digital filter process explained above, the computation unit 130 is equipped with an input-data storage unit 131, a coefficient-data storage unit 132, a digital-filter computation unit 133, a coefficient-data computation unit 134, and a main processing unit 135.

Figure 3:
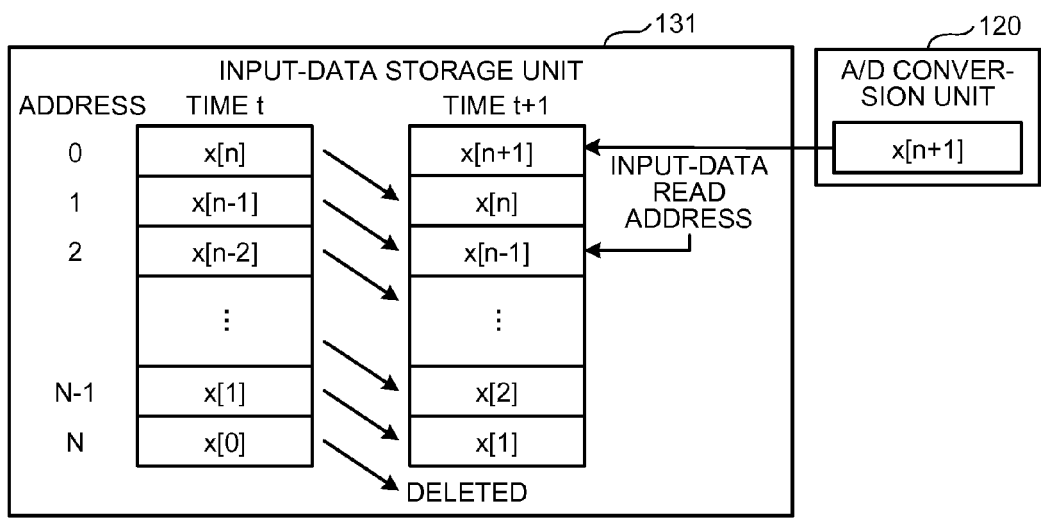
FIG. 3 is a diagram showing a memory configuration of an input-data storage unit.

FIG. 3 is a diagram showing a memory configuration of the input-data storage unit 131. Input data from the A/D conversion unit 120 are stored in the input-data storage unit 131 for each A/D conversion period. The input-data storage unit 131 stores N+1 pieces of input data in its block of memory areas having successive addresses with the input data being arranged from the beginning memory area in order of delay amount. When the input-data storage unit 131 newly stores new input data, the N+1 pieces of input data stored in the input-data storage unit 131 are shifted piece by piece, and the oldest data are deleted. The new input data are then added to the beginning of the memory areas that constitute the input-data storage unit 131.

A storage method for the input-data storage unit 131 is not limited to the method described above, as long as the storage method is a method of arranging a plurality of digital values that are outputted most lately in order of delay amount and storing the digital values so that each digital value is positioned at a fixed address according to the delay amount. For example, it is also possible that the input-data storage unit 131 stores digital values in order of delay amount so that the oldest digital value is positioned at the beginning.

Explanations will be given below assuming that, for example, an operation (addition, deletion and shifting of input data) of the stored contents of the input-data storage unit 131 is performed by the digital-filter computation unit 133 described later.

The input-data storage unit 131 may be constituted by a hardware circuit. For example, it is possible that the input-data storage unit 131 is constituted by a shift register and the input data are added, deleted and shifted by the digital-filter computation unit 133 operating a shifting control signal. In addition, a counter signal from the counter 180 may be used as the shifting control signal. The input-data storage unit 131 may be also constituted by a small-scale memory device. Furthermore, the internal memory 190 may be caused to function as the input-data storage unit 131.

Figure 4:
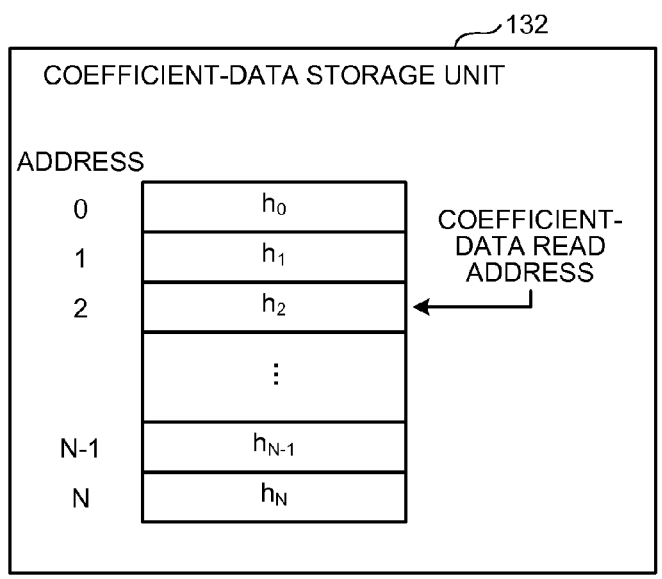
FIG. 4 is a diagram showing a memory configuration of a coefficient-data storage unit.

FIG. 4 shows a memory configuration of the coefficient-data storage unit 132. The coefficient-data storage unit 132 has a block of memory areas with successive addresses, and coefficient data $h_0$ to $h_N$ are arranged from the beginning in order of delay amount and stored in the coefficient-data storage unit 132. In other words, the coefficient-data storage unit 132 stores therein the coefficient data $h_0$ to $h_N$ so that the coefficient data $h_0$ to $h_N$ are arranged respectively in order of delay amount and are positioned at their fixed addresses according to the corresponding delay amounts, respectively.

An operation of storing the coefficient data $h_0$ to $h_N$ in the coefficient-data storage unit 132 is performed by the coefficient-data computation unit 134 described later. The number of coefficient data pieces stored in the coefficient-data storage unit 132 depends on the order calculated by the coefficient-data computation unit 134. The coefficient-data storage unit 132 may be constituted by a small-scale memory device or a hardware circuit such as a register. Alternatively, the internal memory 190 may be caused to function as the coefficient-data storage unit 132.

The digital-filter computation unit 133 performs a computation (a digital filter computation) of obtaining output data. The digital-filter computation unit 133 reads a piece of input data from the input-data storage unit 131 and a piece of coefficient data from the coefficient-data storage unit 132 for each delay amount. The digital-filter computation unit 133 then performs a computation of the formula (1) using the read values. To realize a digital filter computation that is as high speed as possible, the digital-filter computation unit 133 may be realized by the hardware circuit shown in FIG. 2.

The coefficient-data computation unit 134 calculates an order and a filter coefficient required for a digital filter computation based on a filter characteristic desired by a user. The coefficient-data computation unit 134 then writes the calculated coefficient data and order in the coefficient-data storage unit 132. An FIR filter is characterized in that the filter can be applied to any of a low-pass filter, a high-pass filter, and a band-pass filter by combination of filter coefficients. Because a method of calculating a filter coefficient is widely known, explanations thereof are omitted here.

The main processing unit 135 is for controlling operations of the whole of the A/D conversion device 100. In the present embodiment, the main processing unit 135 functions as a receiving unit that receives various requests (a digital-filter process performing request and a digital-filter process stop request, described later) and setting information which have been transmitted from the CPU device 200 or the peripheral device 2000 in cooperation with the bus interface 160. The main processing unit 135 also subjects a value inputted from the A/D conversion unit 120 to various computations and outputs a digital value according to various functions.

The shared memory 140 includes a filter-characteristic storage area 141. The filter-characteristic storage area 141 is a memory area for storing therein a filter characteristic, a digital-filter process performing request and a digital-filter process stop request.

A filter characteristic (setting information) stored in the filter-characteristic storage area 141 is a frequency response characteristic and is determined by a user according to, for example, a frequency of the input data and a frequency of a noise that is desired to be removed. The filter characteristic set in the filter-characteristic storage area 141 may be data for specifying the type of a filter such as a low-pass filter, a band-pass filter or a high-pass filter. Alternatively, the filter characteristic set in the filter-characteristic storage area 141 may be data for specifying a passband, an attenuation band or a stopband.

A filter characteristic is written in the filter-characteristic storage area 141 by any one of the following two methods. A first method is a method that the computation unit 220 of the CPU device 200 executes a user program stored in the internal memory 230 or an external memory so as to generate a filter characteristic and writes the filter characteristic in the filter-characteristic storage area 141. This is realized by virtue of the filter-characteristic storage area 141 being provided in the shared memory 140 that is directly writable from the CPU device 200.

In a second method, a user first inputs a filter characteristic in the filter-characteristic input support tool 500 of the external peripheral device 2000. Next, the filter-characteristic input support tool 500 writes the inputted filter characteristic in the filter-characteristic storage area 141 via the CPU device 200 and the inter-device bus 300. It is noted that the filter-characteristic input support tool 500 may display a drawing screen on a display screen so as to prompt a user to input a curve representing a frequency characteristic, and handle the curve inputted through the drawing screen as an inputted filter characteristic.

A digital-filter process performing request is information that functions as a trigger for changing a filter characteristic. That is, when the main processing unit 135 detects that a digital-filter process performing request has been written in the filter-characteristic storage area 141, the main processing unit 135 can cause the coefficient-data computation unit 134 to update a filter coefficient. For simplicity, description will be given herein assuming that a digital-filter process performing request is used as a trigger for starting processes of the coefficient-data computation unit 134 and the digital-filter computation unit 133, and a digital-filter process stop request is used as a trigger for stopping the process of the digital-filter computation unit 133.

Predetermined flag information may be used as a digital-filter process performing request and a digital-filter process stop request. That is, it is possible to define that if the value of flag information is "1", a digital-filter process performing request has been written and if the value of flag information is "0", a digital-filter process stop request has been written.

The A/D conversion device 100 can receive a digital-filter process performing request and a digital-filter process stop request in compliance with any one of the following four methods.

A method of receiving a request issued by the CPU device 200

A method of receiving a request issued by the filter-characteristic input support tool 500

A method of receiving a request issued by the computation unit 130 itself based on a computation result of the computation unit 130

A method of receiving a trigger signal inputted from the trigger-signal input interface 150 as a request.

It is noted that the filter-characteristic storage area 141 may store therein a plurality of filter characteristics. For example, a receiving unit may receive filter-characteristic specification data for specifying one of the filter characteristics stored in the filter-characteristic storage area 141 together with a digital-filter process performing request, and the coefficient-data computation unit 134 calculates an order and a filter coefficient based on the filter characteristic specified by the filter-characteristic specification data using input of the digital-filter process performing request as a trigger.

The shared memory 140 includes a digital-value storage area 142 for storing therein a digital value. A digital value stored in the digital-value storage area 142 is output data from the digital-filter computation unit 133.

It is noted that a digital value outputted from the digital-filter computation unit 133 may be processed in the main processing unit 135 and then stored in the digital-value storage area 142.

Next, an operation of the A/D conversion device 100 according to the embodiment of the present invention is described. FIG. 5 is a flowchart for explaining the operation of the A/D conversion device 100 according to the embodiment of the present invention.

The main processing unit 135 determines whether or not there is a digital-filter process performing request (Step S1). Presence or absence of a digital-filter process performing request is determined based on whether or not a digital-filter process performing request has been written in the filter-characteristic storage area 141. If there is no digital-filter process performing request (NO at Step S1), the main processing unit 135 performs a determination process of Step S1 again.

If there is a digital-filter process performing request (YES at Step S1), the coefficient-data computation unit 134 reads a filter characteristic out from the filter-characteristic storage area 141 and computes a filter coefficient and an order (Step S2). If a filter coefficient has been able to be calculated normally at Step S2 (YES at Step S3), the filter coefficient is stored in the coefficient-data storage unit 132 (Step S4).

If a filter coefficient has been unable to be calculated normally (NO at Step S3), the process of Step S1 is performed again. Examples of a case where a filter coefficient cannot be calculated normally include a case where an inputted filter-characteristic is inconsistent and a case where a value that cannot be processed by the A/D conversion device 100 is inputted thereto.

After the process of Step S4, the digital-filter computation unit 133 determines whether or not the process has reached the next A/D conversion period (Step S5). If the process has not reached the next A/D conversion period (NO at Step S5), the digital-filter computation unit 133 performs the process of Step S5 again so as to wait until the process reaches the next A/D conversion period.

If the process has reached the next A/D conversion period (YES at Step S5), the digital-filter computation unit 133 shifts input data stored in the input-data storage unit 131 to an adjacent address one by one and deletes the oldest data (Step S6). The digital-filter computation unit 133 then stores a digital value generated by the A/D conversion unit 120 in the beginning of the input-data storage unit 131 (Step S7).

Next, the digital-filter computation unit 133 initializes output data, an input-data read address and a coefficient-data read address (Step S8). As shown in FIG. 3, the input-data read address is a pointer that indicates a position within a memory area included in the input-data storage unit 131. As shown in FIG. 4, the coefficient-data read address is a pointer that indicates a position within a memory area included in the coefficient-data storage unit 132. Since the latest input data are stored in the beginning address of the input-data storage unit 131 and a filter coefficient corresponding to the latest input data is stored in the beginning address of the coefficient-data storage unit 132, the input-data read address and the coefficient-data read address are initialized to address 0 (zero), respectively in the process of Step S8. Storage positions of the input-data read address and the coefficient-data read address are not particularly limited.

Next, the digital-filter computation unit 133 repeats a loop process in which Steps S9 and S14 are loop ends for the number of times equal to an order (Step S9). The order is the value calculated at Step S2.

In the loop process, the digital-filter computation unit 133 reads input data addressed by an input-data read address out from the input-data storage unit 131 (Step S10). The digital-filter computation unit 133 then reads a filter coefficient addressed by a coefficient-data read address out from the coefficient-data storage unit 132 (Step S11).

The digital-filter computation unit 133 multiplies the read input data and filter coefficient and adds a value obtained by the multiplication to intermediate data (Step S12). The storage position of the intermediate data is not particularly limited. For example, the intermediate data may be stored in the internal memory 190.

The digital-filter computation unit 133 then increments the input-data read address and the coefficient-data read address, respectively (Step S13).

The digital-filter computation unit 133 determines whether or not the loop process is repeated for the number of times equal to the order (Step S14). If the number of repetitions is less than the number of times equal to the order, the digital-filter computation unit 133 returns to the process of Step S9. If the number of repetitions is equal to the order, the digital-filter computation unit 133 exits the loop process.

After exiting the loop process, the digital-filter computation unit 133 stores the intermediate data obtained after the loop process in the digital-value storage area 142 as output data (Step S15).

Next, the main processing unit 135 checks whether or not there is a digital-filter process stop request (Step S16). Presence or absence of a digital-filter process stop request is determined based on whether or not a digital-filter process stop request has been written into the filter-characteristic storage area 141. If there is no digital-filter process stop request (NO at Step S16), the digital-filter computation unit 133 performs the process of Step S5 again.

If there is a digital-filter process stop request (YES at Step S16), the determination process of Step S1 is performed again.

As described above, according to the embodiment of the present invention, the A/D conversion device 100 includes the input-data storage unit 131 that arranges a plurality of digital values outputted most lately in order of delay amount and stores therein the digital values so that each of the digital values is positioned at a fixed address according to the delay amount, the filter-characteristic storage area 141 that stores therein setting information for specifying a filter characteristic, the coefficient-data storage unit 132 that stores therein a filter coefficient, the main processing unit 135 and the bus interface 160 that function as a receiving unit that receives a digital-filter process performing request, the coefficient-data computation unit 134 that, when the receiving unit receives a digital-filter process performing request, calculates an order and filter coefficients the number of which is equal to the order based on a filter characteristic stored in the filter-characteristic storage area 141, arranges the calculated filter coefficients in order of delay amount, respectively, and stores the filter coefficients in the coefficient-data storage unit 132 so that each of the filter coefficients is positioned at a fixed address according to the corresponding delay amount, and the digital-filter computation unit 133 that performs an operation of reading digital values the number of which is equal to the order out from the input-data storage unit 131 and filter coefficients the number of which is equal to the order out from the coefficient-data storage unit 132, respectively, based on the addresses where they are stored, for each delay amount, performing a filter computation based on the read values for each delay amount, and outputting a computation result, for each A/D conversion period. Therefore, when receiving a digital-filter process performing request, the A/D conversion device 100 can start to output a digital value to which a digital filter having a specified filter characteristic is applied, so that it is possible to realize a digital filter process with a filter characteristic desired by a user. Further, the A/D conversion device 100 stores each input data piece in a fixed address according to a delay amount. Therefore, any termination determining process needed when a digital value is stored in a ring buffer is not required, and thus the load on the process of A/D conversion is reduced. In addition, the A/D conversion device 100 stores each filter coefficient in a fixed address according to a delay amount, and thus it is possible to prevent the size of an area for storing therein filter coefficients from becoming larger. Because the A/D conversion device can perform a digital filter process for each A/D conversion period, a digital value can be outputted in the same period as a period in the case of no digital filter process. That is, it is possible to obtain a digital value after the digital filter process while keeping a speed-up A/D conversion period equal to that of a conversion speed of the A/D conversion unit 120.

Besides, an external device such as the peripheral device 2000 or the CPU device 200 is connected to the A/D conversion device 100, and the receiving unit receives an execution request from the external device. With this configuration, a user can rewrite a filter characteristic and input a digital-filter process performing request via the peripheral device 2000, and thus a digital filter characteristic can be freely changed according to a product handled by an apparatus in which the PLC 1000 is installed. Accordingly, even in a production line that handles a plurality of products, the digital filter characteristic can be easily changed for each product.

The filter-characteristic storage area 141 stores therein a plurality of different pieces of setting information and the receiving unit receives filter-characteristic specification data for specifying one of the setting information pieces stored in the filter-characteristic storage area 141 from the external device together with a digital-filter process performing request. The coefficient-data computation unit 134 calculates an order and a filter coefficient based on a filter characteristic specified by the filter-characteristic specification data. Accordingly, a user can easily change a digital filter characteristic for each product.

A programmable display that functions as an HMI (Human Machine Interface) of the PLC 1000 is also within the concept of the peripheral device 2000 according to the embodiment of the present invention. That is, a user can easily change a digital filter characteristic through the programmable display.

The receiving unit receives an input of a filter characteristic from the external device and stores the filter characteristic in the filter-characteristic storage area 141. With this configuration, a user can set a filter characteristic through the external device.

INDUSTRIAL APPLICABILITY

As described above, the conversion device, the peripheral device and the programmable logic controller according to the present invention are suitable to be applied for a conversion device that performs A/D conversion, a peripheral device that operates or sets the conversion device according to an operation of a user, and a programmable logic controller that includes the conversion device.

REFERENCE SIGNS LIST

100 A/D conversion device, 110 analog input interface, 120 A/D conversion unit, 130 computation unit, 131 input-data storage unit, 132 coefficient-data storage unit, 133 digital-filter computation unit, 134 coefficient-data computation unit, 135 main processing unit, 140 shared memory, 141 filter-characteristic storage area, 142 digital-value storage area, 150 trigger-signal input interface, 160 bus interface, 170 internal bus, 180 counter, 200 CPU device, 210 external memory interface, 220 computation unit, 230 internal memory, 240 peripheral device interface, 250 bus interface, 260 internal bus, 300 inter-device bus, 500 filter-characteristic input support tool, 2000 peripheral device, 3000 connection cable.

The invention claimed is:

1. A conversion device comprising:
an A/D conversion unit that sequentially converts an analog value into a digital value for each A/D conversion period and outputs the digital value;
an input-data storage unit that arranges a plurality of digital values that are outputted most lately in order of delay amount and stores therein the digital values so that each of the digital values is positioned at a fixed address according to a delay amount;
a filter-characteristic storage unit that stores therein setting information for specifying a filter characteristic;
a coefficient-data storage unit that stores therein a filter coefficient;
a receiving unit that receives an execution request;
a coefficient-data computation unit that, when the receiving unit receives the execution request, reads setting information out from the filter-characteristic storage unit to calculate an order and filter coefficients number of which is equal to the order based on the read setting information, arranges the calculated filter coefficients in order of delay amount, respectively and stores the filter coefficients in the coefficient-data storage unit so that each of the filter coefficients is positioned at a fixed address according to the corresponding delay amount; and
a digital-filter computation unit that performs for each A/D conversion period an operation of reading digital values number of which is equal to the calculated order from the input-data storage unit and filter coefficients the number of which is equal to the calculated order from the coefficient-data storage unit based on addresses where the values and coefficients are stored for each delay amount, respectively, performing a filter computation based on the read values for each delay amount, and outputting a computation result thereof.

2. The conversion device according to claim 1, wherein an external device is connected to the conversion device, and
the receiving unit receives the execution request from the external device.

3. The conversion device according to claim 2, wherein the filter-characteristic storage unit stores therein a plurality of different pieces of setting information,
the receiving unit receives a specification request that specifies one of the setting information pieces stored in the filter-characteristic storage unit from the external device with the execution request, and
the coefficient-data computation unit calculates an order and a filter coefficient based on setting information specified by the specification request.

4. The conversion device according to claim 2, wherein the receiving unit receives the setting information from the external device and stores the received setting information in the filter-characteristic storage unit.

5. The conversion device according to claim 4, wherein the external device is a peripheral device that receives an operation directly from a user or a CPU device that constitutes a programmable logic controller in combination with the conversion device.

6. The conversion device according to claim 5, wherein the setting information is information for specifying a filter type including a low-pass filter, a high-pass filter, and a band-pass filter or information for specifying a passband, an attenuation band or a stopband.

7. The conversion device according to claim 6, wherein the filter computation includes separately multiplying a digital value read out from the coefficient-data storage unit and a filter coefficient read out from the coefficient-data storage unit for each delay amount and accumulating the values of the multiplication results obtained for each delay amount.

8. The conversion device of claim 1, and further combined with a peripheral device that inputs the execution request to the conversion device according to an operation of a user.

9. The combination of claim 8, wherein the peripheral device receives input of a filter characteristic from the user, describes the input filter characteristic in setting information, and stores the setting information in the filter-characteristic storage unit.

10. The combination of claim 9, wherein said peripheral device stores a plurality of different pieces of setting information in the filter-characteristic storage unit and inputs a specification request for specifying one of the setting information pieces stored in the filter-characteristic storage unit to the conversion device with the execution request according to an operation of the user.

11. A programmable logic controller comprising:
an A/D conversion unit that sequentially converts an analog value into a digital value for each A/D conversion period and outputs the digital value;
an input-data storage unit that arranges a plurality of digital values that are outputted most lately in order of delay amount and stores therein the digital values so that each of the digital values is positioned at a fixed address according to a delay amount;
a filter-characteristic storage unit that stores therein setting information for specifying a filter characteristic;
a coefficient-data storage unit that stores therein a filter coefficient;
a receiving unit that receives an execution request;
a coefficient-data computation unit that, when the receiving unit receives the execution request, reads setting information out from the filter-characteristic storage unit to calculate an order and filter coefficients number of which is equal to the order based on the read setting information, arranges the calculated filter coefficients in order of delay amount, respectively and stores the filter coefficients in the coefficient-data storage unit so that each of the filter coefficients is positioned at a fixed address according to the corresponding delay amount; and
a digital-filter computation unit that performs for each A/D conversion period an operation of reading digital values number of which is equal to the calculated order from the input-data storage unit and filter coefficients the number of which is equal to the calculated order from the coefficient-data storage unit based on addresses where the values and coefficients are stored for each delay amount, respectively, performing a filter computation based on the read values for each delay amount, and outputting a computation result thereof; and
a CPU device that inputs the execution request to the conversion device based on a user program having been stored in advance.

* * * * *